United States Patent
Wang et al.

(10) Patent No.: US 12,544,805 B2
(45) Date of Patent: Feb. 10, 2026

(54) METHOD AND APPARATUS TO ENABLE DROPLET JET CLEANING AT ELEVATED TEMPERATURE

(71) Applicant: Applied Materials, Inc., Santa Clara, CA (US)

(72) Inventors: Ying Wang, San Diego, CA (US); Eric J. Bergman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 12 days.

(21) Appl. No.: 18/205,067

(22) Filed: Jun. 2, 2023

(65) Prior Publication Data
US 2024/0399425 A1    Dec. 5, 2024

(51) Int. Cl.
*B08B 3/10*  (2006.01)
*B08B 3/02*  (2006.01)
*B08B 5/02*  (2006.01)

(52) U.S. Cl.
CPC .............. *B08B 3/10* (2013.01); *B08B 3/02* (2013.01); *B08B 5/02* (2013.01); *B08B 2203/007* (2013.01); *B08B 2205/00* (2013.01)

(58) Field of Classification Search
CPC . B08B 2203/007; B08B 2205/00; B08B 3/02; B08B 3/10; B08B 5/02; H01L 21/67051
See application file for complete search history.

(56) References Cited

U.S. PATENT DOCUMENTS

| | | | |
|---|---|---|---|
| 2007/0246081 A1* | 10/2007 | Lu | H01L 21/67051 134/33 |
| 2010/0154833 A1* | 6/2010 | Endo | G03F 7/3057 134/105 |
| 2015/0147888 A1 | 5/2015 | Nonaka et al. | |
| 2020/0376522 A1 | 12/2020 | Wu et al. | |
| 2022/0216074 A1 | 7/2022 | Tang et al. | |

FOREIGN PATENT DOCUMENTS

| | | | |
|---|---|---|---|
| JP | 2008053679 A | 3/2008 | |
| KR | 20210059854 A | 5/2021 | |
| WO | WO-2017052044 A1 * | 3/2017 | ............. H01L 21/02 |

OTHER PUBLICATIONS

Machine translation of WO2017/052044A1 (Year: 2017).*
International Search Report and Written Opinion dated Aug. 6, 2024 re: PCT application No. PCT/US2024/024841.

* cited by examiner

*Primary Examiner* — Douglas Lee
(74) *Attorney, Agent, or Firm* — Patterson + Sheridan, LLP (57) ABSTRACT

Embodiments of the disclosure include an apparatus and method of cleaning a substrate. The disclosure describes a method of cleaning a substrate includes supplying a gas at a gas temperature and a gas mass flow rate to a nozzle. The method also includes supplying a liquid at a liquid temperature and a liquid mass flow rate to the nozzle. The method also includes mixing the gas with the liquid in the nozzle to form a fluid mixture having a mixture temperature of not more than about 10° C. below the liquid temperature. The method also includes spraying the fluid mixture onto a surface of the substrate through an orifice in the nozzle.

18 Claims, 4 Drawing Sheets

METHOD AND APPARATUS TO ENABLE DROPLET JET CLEANING AT ELEVATED TEMPERATURE

BACKGROUND

Field

Embodiments of the present disclosure generally relate to a method of cleaning a wafer for semi-conductor manufacturing. In particular, methods and apparatus for elevated temperature droplet jet cleaning of a semiconductor wafer are provided.

Description of the Related Art

Substrate processing units may perform cleaning operations prior to being packaged. The removal of contaminants is always a focus in the semiconductor manufacturing industry. Contaminant removal is dependent on where the substrate is within the manufacturing process. Further, some cleaners used during cleaning operations are costly. Efforts to maximize the efficiency of cleaning fluid to thereby reduce cost are always a consideration. Thus, there is a need in the art for more efficient apparatus and methods of cleaning substrates.

SUMMARY

In some embodiments, a method of cleaning a substrate is provided. The method includes supplying a gas at a gas temperature and a gas mass flow rate to a nozzle. The method also includes supplying a liquid at a liquid temperature and a liquid mass flow rate to the nozzle. The method also includes mixing the gas with the liquid in the nozzle to form a fluid mixture having a mixture temperature of not more than about 10° C. below the liquid temperature. The method also includes spraying the fluid mixture onto a surface of the substrate through an orifice in the nozzle.

In some embodiments, a method of cleaning a substrate is provided. The method includes wetting a substrate surface with a wetting fluid from a wetting nozzle. The method also includes supplying a gas at a gas mass flow rate and a gas temperature to an aerosol nozzle. The method also includes supplying a liquid at a liquid mass flow rate and a liquid temperature to the aerosol nozzle, where the gas temperature is greater than the liquid temperature. The method also includes mixing the gas and the liquid in the aerosol nozzle to form a fluid mixture at a mixture temperature that is greater than about 35° C. The method also includes spraying the fluid mixture at a surface of the substrate. The method also includes translating the aerosol nozzle from a first point to a second point on the surface of the substrate. The method also includes translating the aerosol nozzle from the second point to the first point, where the wetting fluid is supplied to the substrate surface while translating the aerosol nozzle from the second point to the first point.

In yet another embodiment, an assembly for cleaning a substrate is provided. The assembly includes a cleaning arm disposed above a substrate where the substrate is disposed on a substrate support. the cleaning arm may include: an aerosol nozzle disposed on the cleaning arm, where the aerosol nozzle is configured to spray a fluid mixture toward the substrate; a heater coupled to the cleaning arm, the heater configured to heat a gas that flows to the aerosol nozzle; and a wetting nozzle coupled to the cleaning assembly configured to spray a wetting fluid toward the substrate support; and a controller, the controller may include a non-transitory computer readable medium. The non-transitory computer readable medium may include instructions that, when executed, cause: a gas to be delivered to the aerosol nozzle at a first mass flow rate; a liquid to be delivered to the aerosol nozzle at a second mass flow rate; mixing the gas and the liquid in the aerosol nozzle, where the gas has a heat capacity and the liquid has a heat capacity different from the gas; and spraying the mixture of the gas and the liquid, where the sprayed mixture has a mixture heat capacity different that the gas and the liquid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for forming a thin-form-factor semiconductor package. In one embodiment, a substrate is cleaned prior to being mounted to a substrate mounting process. The methods and apparatus disclosed herein further include novel thin-form-factor semiconductor package cleaning processes. The methods and apparatus disclosed herein provide semiconductor package cleaning processes that further increase the efficiency of semiconductor substrate cleaning. This efficiency is accomplished by mixing a gas and a liquid to form a mixture in the form of a cleaning aerosol. The cleaning aerosol is sprayed on the surface of a substrate to remove containments. The addition of heat into the cleaning operation further aids in the removal of contaminants by adding both thermal and kinetic energy into the system. A heater can add thermal energy to the gas such that the mixture maintains a higher temperature that provides a higher efficiency cleaning operation. Traditional mixtures would normally be applied to the surface of a substrate at a lower temperature due to the expansion of the gas and resultant temperature drop. This disclosure overcomes that temperature drop by heating the gas while using a high gas to liquid ratio such that the large amount of high temperature gas overcomes the thermal energy loss due to expansion.

Figure 1:
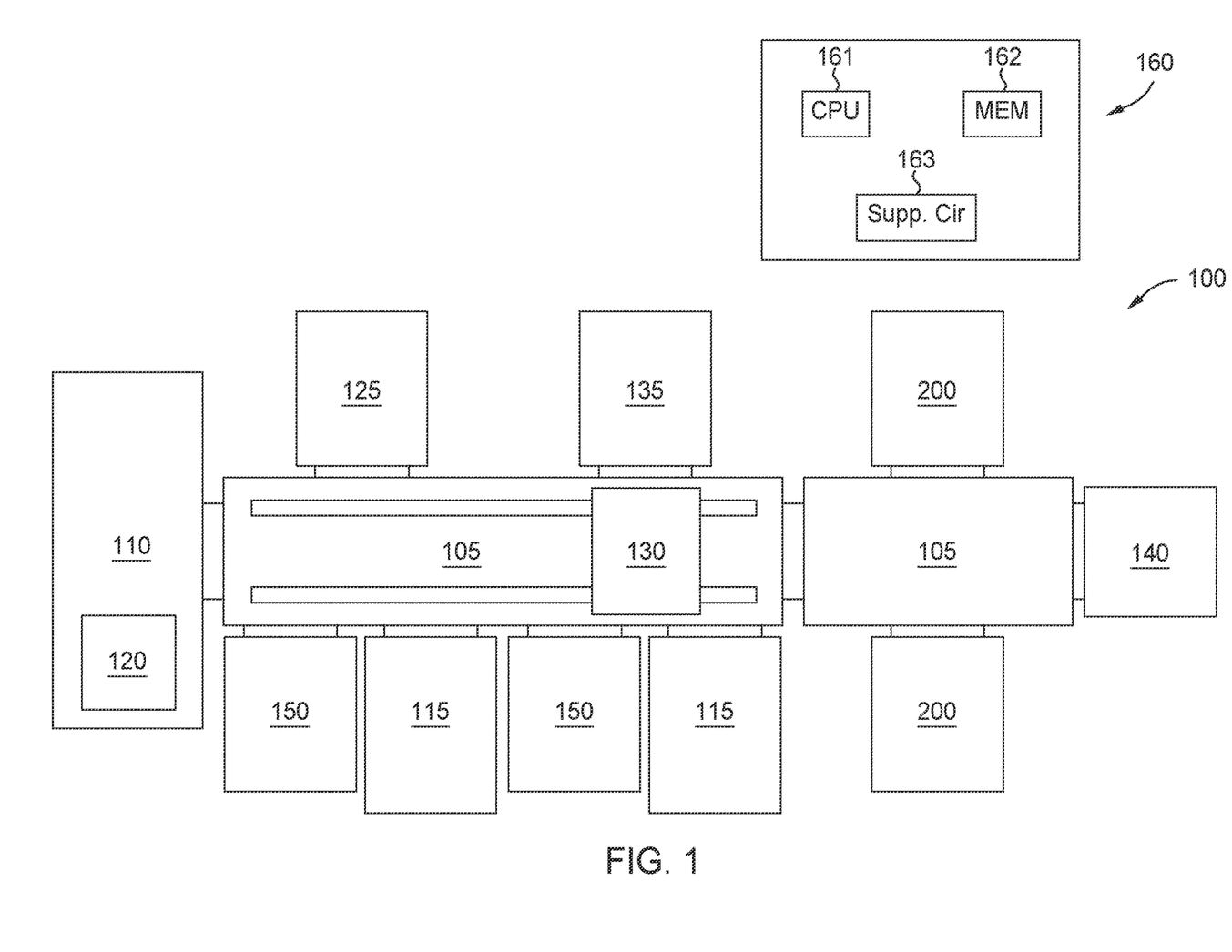
FIG. 1 is a schematic illustration of a cleaning system according to some embodiments.

FIG. 1 shows a schematic illustration of a cleaning system 100 for advanced packaging according to an embodiment of the present disclosure. The cleaning system 100 comprises an Equipment Front End Module (EFEM) 110 configured to load and unload substrates 120; an Automated Modular Mainframe (AMM) 130 having an integrated wafer transfer robot for transporting a substrate 120 through the cleaning system 100; a wafer aligner 105 for precisely aligning the substrate 120; one or more wet clean modules 200 for initial cleaning of the substrate surface; one or more brush box cleaning modules 115 for removing residues and particles from the substrate surface; one or more degas modules 125 for removing absorbed moisture and contaminants from the substrate surface; one or more plasma modules 135 for substrate surface activation and cleaning; an ultraviolet (UV) module 140 for curing a bonding interface of the substrate 120; and one or more bonder modules 150 for bonding dies of the substrate 120. The terms substrate and wafer are utilized interchangeably throughout the disclosure provided herein to describe a multiple die containing work piece on which one or more of the methods described herein are to be performed on.

In some embodiments, operation of the cleaning system 100, is directed by a system controller 160. The system controller 160 includes a programmable central processing unit (CPU) 161 which is operable with a memory 162 (e.g., non-volatile memory) and support circuits 163. The support circuits 163 are conventionally coupled to the CPU 161 and comprise cache, clock circuits, input/output subsystems, power supplies, and the like, and combinations thereof coupled to the various components of the CMP processing system 100, to facilitate control thereof. The CPU 161 is one of any form of general purpose computer processor used in an industrial setting, such as a programmable logic controller (PLC), for controlling various components and sub-processors of the processing system. The memory 162, coupled to the CPU 161, is non-transitory and is typically one or more of readily available memories such as random access memory (RAM), read only memory (ROM), floppy disk drive, hard disk, or any other form of digital storage, local or remote.

Typically, the memory 162 is in the form of a non-transitory computer-readable storage media containing instructions (e.g., non-volatile memory), which when executed by the CPU 161, facilitates the operation of the cleaning system 100. The instructions in the memory 162 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 160 may be used with one or any combination of the various modular polishing systems described herein and/or with the individual polishing modules thereof.

Figure 2:
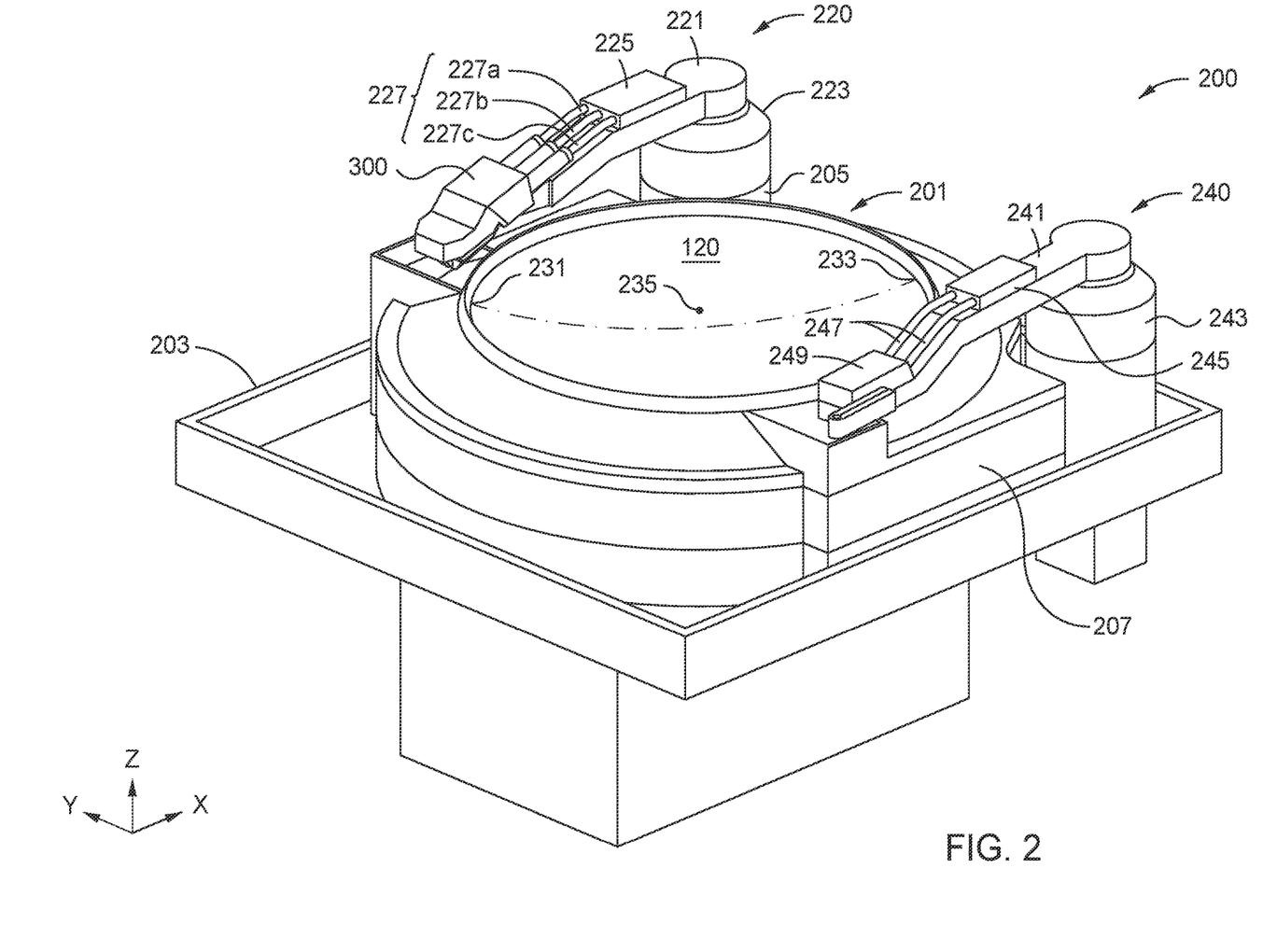
FIG. 2 is a schematic illustration of a wet clean according to some embodiments.

FIG. 2 shows a schematic illustration of the wet clean module 200 according to some embodiments. The module 200 is a cleaning assembly that includes a cleaning arm assembly 220, a basin 201, and a substrate support assembly 207. In some embodiments the module 200 may also include a second arm assembly 240. The substrate support assembly 207 is configured to rotate the substrate 120 during a cleaning process. The basin 201 includes a mixture catch 203. As the module 200 supplies cleaning fluids into the basin, the cleaning fluids fall off the substrate 120 and into the mixture catch 203 for recycling or disposal. The substrate support assembly 207 may include ports (not shown) to connect and communicate with the controller 160. The substrate support assembly 207 may also include a heated tank 205. The heated tank 205 is configured to heat a fluid as discussed in more detail below.

The cleaning arm assembly 220 includes a motor base 223, an arm 221, a manifold 225, fluid supply lines 227, and a nozzle assembly 300. The motor base 223 is coupled to the substrate support assembly 207. The motor base 223 includes ports (not shown) to connect and communicate with the controller 160. The motor base 223 is configured to rotate the arm 221 above the substrate 120. The motor base 223 includes a motor, for example, an electric, pneumatic, or hydraulic motor. The motor base 223 enables the arm 221 to translate the nozzle assembly 300 from the center 235 of the substrate 120 to the radial edges of the substrate 120. In some embodiments, the arm 221 is capable of translating the nozzle assembly 300 back and forth from a first point 231 on the substrate 120, through the center 235 of the substrate 120, to a second point 233 on the substrate 120.

The manifold 225 is coupled to the arm 221 and is fluidly coupled (i.e., coupled to and in fluid communication with) the supply lines 227. The manifold 225 enables control of a first fluid and a second fluid going to the nozzle assembly 300. In some embodiments, the manifold 225 is located within or beneath the substrate support assembly 207 rather than attached to the arm 221 as shown. The manifold 225 supplies the first fluid to a first supply line 227a and the second fluid to a second supply line 227b. In some embodiments, the manifold 225 also supplies a third fluid to a third supply line 227c. The supply lines 227 may be formed of a polymer, such as polyether ether ketone (PEEK), Polytetrafluoroethylene (PTFE), polyvinylidene fluoride (PVDF) nylon, vinyl, polyurethane, polyethylene, or any combination thereof. Alternatively, the supply lines 227 may be formed of stainless steel, an alloy, a ceramic, or any combination thereof. The supply lines 227 fluidly connect the manifold 225 to the nozzle assembly 300.

In some embodiments, each supply line 227a, 227b, 227c is configured to transport a different fluid to the nozzle assembly 300. In other embodiments, the first supply line 227a may transport a gas from a gas supply (not shown), the second supply line 227b may transport a liquid from the heated tank 205, and the third supply line 227c may transport the same or a different liquid as the second supply line 227b to the nozzle assembly 300. In some embodiments, fluid may be pumped from the heated tank 205 through the supply lines 227b, 227c to the nozzle assembly 300. In some embodiments, the third supply line 227c supplies deionized (DI) water from a DI water source to the nozzle assembly 300. Pumps (not shown) connected to the controller 160 (FIG. 1) may be used to control the flow of fluid through the supply lines 227b, 227c. In some embodiments, the controller 160 controls valves (not shown) that measure mass flow rates of fluids and control the mass flow passing through the valves.

In embodiments with the second arm assembly 240, the second arm assembly 240 includes a wetting arm 241, a wetting arm motor 243, a wetting manifold 245, one or more wetting supply lines 247, and a wetting fluid dispenser 249. The wetting arm motor 243 is coupled to the substrate support assembly 207. The wetting arm motor 243 includes ports (not shown) to connect and communicate with the controller 160. The wetting arm motor 243 is configured to rotate the wetting arm 241 above the substrate 120. The wetting arm motor 243 includes a motor, for example an electric, pneumatic, or hydraulic motor. The motor base 223 enables the wetting arm 241 to translate the wetting fluid dispenser 249 from the center 235 of the substrate 120 to the radial edges of the substrate 120. In some embodiments, the wetting arm 241 is capable of translating the wetting fluid dispenser 249 along the same path as the nozzle assembly 300 such that the wetting fluid dispenser 249 leads and/or follows the nozzle assembly 300.

The wetting manifold 245 is coupled to the wetting arm 241 and is fluidly coupled (i.e., coupled to and in fluid communication with) the wetting supply lines 247. The wetting manifold 245 enables control of a wetting fluid going to the wetting fluid dispenser 249. In some embodiments, the wetting manifold 245 is located within or beneath the substrate support assembly 207 rather than attached to the wetting arm 241 as shown. The wetting manifold 245 supplies the wetting fluid to the wetting fluid dispenser 249. The wetting supply lines 247 may be formed of a polymer, such as PEEK, PTFE, PVDF, nylon, vinyl, polyurethane, polyethylene, or any combination thereof. Alternatively, the wetting supply lines 247 may be formed of stainless steel, an alloy, a ceramic, or any combination thereof. The wetting supply lines 247 fluidly connect the wetting manifold 245 to the wetting fluid dispenser 249.

Figure 3:
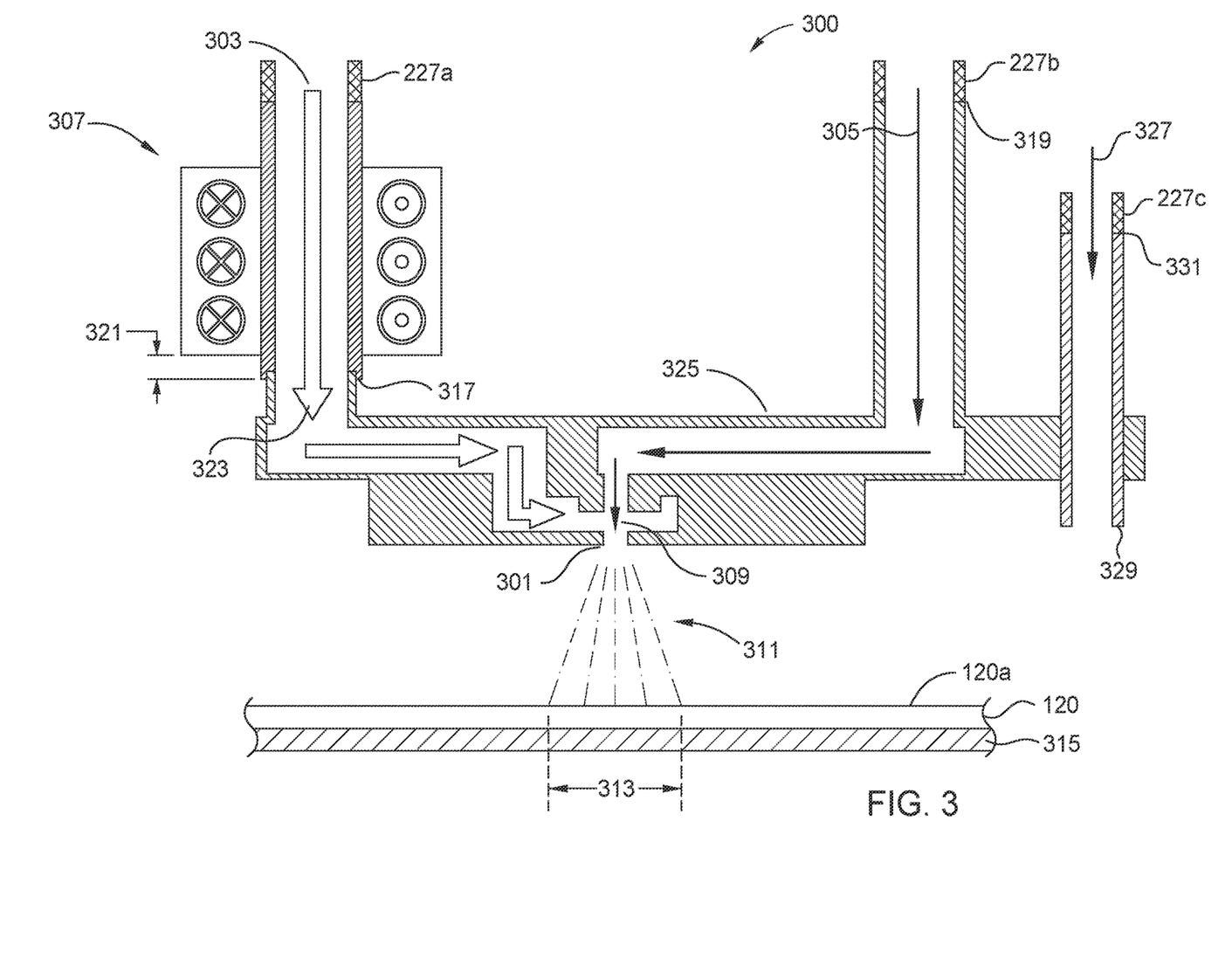
FIG. 3 is a schematic illustration of a nozzle disposed within the wet clean module according to some embodiments.

FIG. 3 illustrates a schematic view of the nozzle assembly 300 according to some embodiments. The nozzle assembly 300 includes a nozzle orifice 301, a nozzle body 325, a first fluid inlet 317, a second fluid inlet 319, a heater 307, a wetting nozzle 329, and a mixing region 309. As shown, a first fluid 303 flows through the heater 307 from the first supply line 227a and enters into the nozzle body 325 through the first fluid inlet 317. A second fluid 305 enters into the nozzle body 325 through the second fluid inlet 319 from the second supply line 227b. A third fluid 327 travels along the supply line 227c and is delivered to the wetting nozzle 329. The wetting nozzle 329 supplies and directs the third fluid 327 to a surface 120a of the substrate 120. The first and second fluids 303, 305 mix in the mixing region 309 to form a fluid mixture 311. The fluid mixture 311 is dispensed from the nozzle body 325 through the nozzle orifice 301 such that the fluid mixture 311 forms an aerosol of the sprayed fluid mixture 311. The mixture 311 dispensed from the nozzle orifice 301 forms a mixture diameter 313 on the surface 120a of the substrate 120. The mixture diameter 313 is defined by the diameter the mixture 311 creates when it contacts the surface 120a of the substrate 120 disposed in the cleaning module 200.

In certain embodiments, the first fluid 303 is a gas. For example, the first fluid 303 may be Argon ($Ar_2$), Nitrogen ($N_2$), Oxygen ($O_2$), or any combination thereof. In other embodiments, the first fluid 303 may be another gas with other additives. In certain embodiments, the second fluid 305 is a liquid. For example, the second fluid 305 may include DI water. In yet another example, the second fluid 305 may include DI water and a chemical solution configured to clean a substrate. In certain embodiments, the third fluid 327 is a liquid. For example, the third fluid 327 may be DI water. The third fluid 327 can help maintain a fluid and/or liquid film on the surface 120a of the substrate 120 during a cleaning operation in, e.g., the cleaning module 200.

In one embodiment, the first fluid 303 is delivered from a first fluid source (not shown), and enters the heater 307 at a first fluid temperature between about 10° C. and about 30° C. For example, the first fluid 303 enters the heater 307 at about 20° C. The first fluid 303 enters the heater 307 at a pressure between about 35 psi and about 85 psi. For example, the first fluid 303 enters the heater 307 at about between about 45 psi and about 75 psi. The first fluid 303 enters the heater 307 at a flowrate between about 30 L/min and about 200 L/min. For example, the first fluid 303 enters the heater 307 at about 125 L/min. The first fluid 303 enters the heater 307 at a first fluid mass flow rate between about 33 g/min and about 233 g/min. For example, the first fluid 303 enters the heater 307 at about 142 g/min. The heater 307 is a heating device configured to heat the first fluid 303. For example, the heater 307 may be a heating device with an internal stainless steel (SS) tube such that the heater 307 does not contaminate the first fluid 303. The stainless steel tube of the heater 307 may include 316SS and or 304SS but other types of SS are contemplated. The heater 307 may be a cartridge heater with internal helical fins, a silicon carbide heater, a blanket heater, or any combination thereof. Other heater 307 configurations designed or modified to heat a gas flowing therethrough are also contemplated. In some embodiments, the heater 307 may be coupled to the nozzle body 325. The first fluid 303 leaves the heater 307 as a heated first fluid 323. As shown, the heater 307 may be disposed a distance 321 from the nozzle body 325. The distance 321 may be between about 5 mm and about 120 mm. For example the heater 307 may be disposed a distance 321 from the nozzle body 325 between about 30 mm and about 100 mm. The proximity of the heater 307 and the nozzle body 325 helps to reduce heat dissipation of the heated first fluid 323 between the heater 307 and the nozzle body 325. The heated first fluid 323 enters the nozzle body 325 at a first heated fluid temperature between about 70° C. and about 90° C. For example, the first heated fluid enters the nozzle body 325 at about 80° C.

As shown in FIG. 3, the second fluid 305 enters the nozzle body 325 at the second fluid inlet 319. The second fluid 305 may be a liquid. For example, the second fluid 305 may include deionized (DI) water, cleaning chemistry, or a combination thereof from the heated tank 205 (FIG. 2). In one embodiment, the second fluid 305 enters the nozzle body 325 at a second fluid temperature between about 50° C. and about 80° C. For example, the second fluid 305 may enter the nozzle body 325 at about 65° C. The second fluid 305 may enter the nozzle body 325 at a pressure between about 20 psi and about 40 psi. For example, the second fluid 305 may enter the nozzle body 325 at about 30 psi. The second fluid 305 may enter the nozzle body 325 at a flowrate between about 10 ml/min and about 100 ml/min. For example, the second fluid 305 may enter the nozzle body 325 at about 20 ml/min. The second fluid 305 may enter the nozzle body 325 at a second fluid mass flow rate between about 10 g/min and about 100 g/min. For example, the second fluid 305 may enter the nozzle body 325 at about 30 g/min. In some embodiments the volumetric flow rate ratio between the first fluid 303 and the second fluid 305 is between about 300 to about 20,000 parts first fluid 303 to between about 1 to about 10 parts the second fluid 305. For example, the volumetric flow rate ratio between the first fluid 303 and the second fluid 305 may between about 1500 to about 750 parts first fluid 303 to between about 2.5 parts to about 1 part the second fluid 305. In yet another example, the volumetric flow rate ratio between the first fluid 303 and the second fluid 305 may between about 500 or more parts of the first fluid 303 to about 1 part second fluid 305. In some embodiments, where the first fluid 303 is a gas and the second fluid 305 is a liquid, the volumetric flow rate of the gas to liquid is at least equal to or greater than 500 parts of the gas to liquid.

As shown in FIG. 3, the third fluid 327 is available to deliver fluid to the substrate surface, immediately adjacent to the nozzle body 325 at the third fluid inlet 331. The third fluid 327 may be a liquid. In some embodiments, the third fluid 327 may be supplied by the nozzle body with a separate fluid path from the previously described first and second fluids which are mixed by the previously described nozzle. In other embodiments, the third fluid 327 is supplied by another nozzle not connected to the nozzle body 325 or a separate port formed in the nozzle body 325. The third fluid 327 may be a wetting fluid according to some embodiments. For example, the third fluid 327 may include deionized (DI) water, cleaning chemistry, or a combination thereof. In one embodiment, the third fluid 327 enters the nozzle body 325 at a third fluid temperature between about 50° C. and about 80° C. For example, the third fluid 327 may enter a delivery point of the nozzle body 325 at about 65° C. The third fluid 327 may enter the delivery point of the nozzle body 325 at a pressure between about 20 psi and about 40 psi. For example, the third fluid 327 may enter the delivery point of the nozzle body 325 at about 30 psi. The third fluid 327 may enter the delivery point of the nozzle body 325 at a flowrate between about 20 ml/min and about 350 ml/min. For example, the third fluid 327 may enter the nozzle body 325 at about 100 ml/min. The third fluid 327 may enter the nozzle body 325 at a third fluid mass flow rate between about 20 g/min and about 100 g/min. For example, the third fluid 327 may enter the nozzle body 325 at about 100 g/min.

The nozzle body 325 may include polyether ether ketone PEEK, PTFE, PVDF, brass, stainless steel, a polymer, an alloy, a ceramic, or any combination thereof. The body includes the mixing region 309 and the nozzle orifice 301. The nozzle orifice 301 is in fluid communication with the mixing region 309, the first fluid inlet 317, and the second fluid inlet 319. In one embodiment, the nozzle orifice 301 includes a diameter between about 0.1 mm and about 2 mm. For example, the nozzle orifice 301 diameter may be about 1 mm. The nozzle orifice 301 is configured to spray the mixture 311 toward the substrate surface 120a as shown in FIG. 3. In one embodiment, the sprayed mixture diameter 313, as discussed above, has an impact diameter where the sprayed mixture 311 contacts the substrate surface 120a between about 3 mm and about 15 mm. For example, the mixture diameter may be about 8 mm. In some embodiments, the mixture 311 contacts the substrate surface 120 in a rectangular. In other embodiments, the mixture 311 contacts the substrate surface 120 in circular or elliptical shape.

The nozzle assembly 300 may be configured such that the mixture 311 is sprayed in an aerosol form. In some embodiments, the nozzle assembly 300 is an aerosol nozzle configured to supply the mixture 311 to the substrate surface 120a. The substrate 120 is position on a substrate support 315. The substrate support 315 rotates the substrate 120 during a cleaning operation. Keeping the mixture 311 in an aerosol form, instead of an atomized or vapor form, enables the mixture 311 droplet to stay larger and thereby retain more heat when the mixture 311 contacts the substrate surface 120a. For example, the mixture 311 may have a droplet size between about 10 microns and about 20 microns when the mixture 311 contacts the substrate surface 120a. For example, at least 50% or more of the mixture 311 may include droplets with a diameter between about 5 microns and about 25 microns when the mixture 311 contacts the substrate surface 120a. In yet another example, at least 70% or more of the mixture 311 may include droplets with a diameter between about 10 microns and about 20 microns when the mixture 311 contacts the substrate surface 120a. In other words, the mixture 311 has a percentage of vaporized mixture less than about 50%. For example, the mixture 311 has a percentage of vaporized mixture less than about 30%. The temperature of the mixture 311 leaving the nozzle orifice 301 is between about 40° C. and about 50° C. For example, the temperature of the mixture 311 leaving the nozzle orifice 301 is between about 43° C. and about 47° C. In some embodiments, the temperature difference between the mixture 311 and the second fluid 305 is less than about 15° C. For example, the first fluid 303 and the second fluid 305 are configured such that the maximum change in temperature between the second fluid 305 and the mixture 311 is less than about 10° C.

Figure 4:
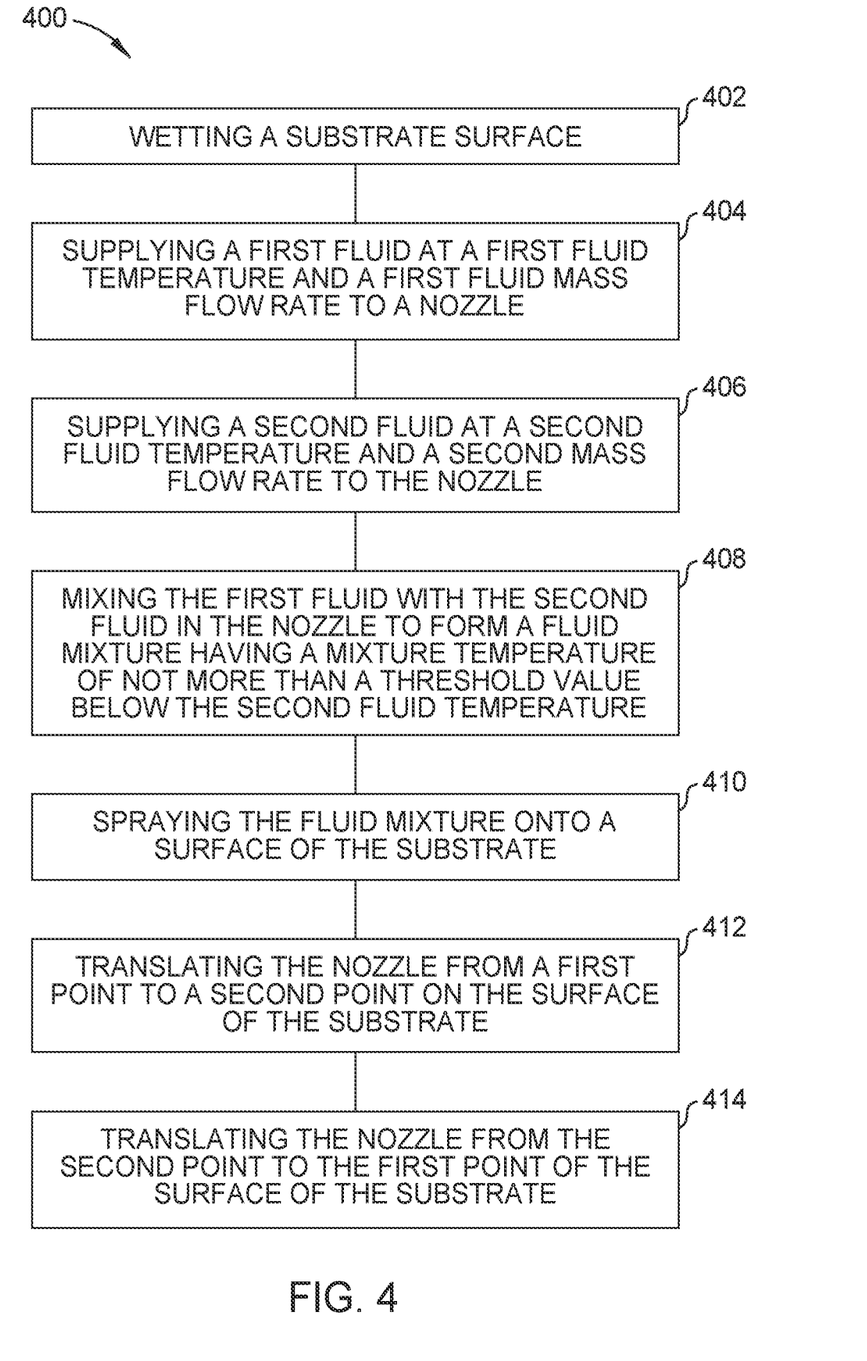
FIG. 4 is a process flow of cleaning a substrate according to some embodiments.

FIG. 4 illustrates a process 400 of using a wet clean module, e.g., the wet clean module 200 including the nozzle assembly 300, to clean a substrate, e.g., the substrate 120. The process 400 may be stored as instructions on a non-transitory computer readable medium in communication with the controller 160, according to some embodiments. In some embodiments, the instructions include instructions for monitoring a gas mass flow rate, a liquid mass flow rate, a gas temperature, a liquid temperature, calculating a heat capacity, and a volumetric flow ratio through the supply lines 227, and the nozzle assembly 300.

The process 400 begins with operation 402 in which the controller 160 causes a wetting fluid to be delivered to the substrate 120. The wetting fluid can be supplied from a wetting nozzle 329 within the nozzle assembly 300, from the wetting fluid dispenser 249, from another wetting fluid delivery method, or any combination thereof. The wetting fluid may be the third fluid 327 in some embodiments. The wetting fluid travels to the wetting nozzle 329 by the supply line 227c according to some embodiments. The wetting fluid may be the third fluid 327. The third fluid 327 may be the same as the second fluid 305 and supplied from the heated tank 205 according to some embodiments. In other embodiments the third fluid 327 may be different than the second fluid 305. For example the third fluid 327 may be DI water supplied from a DI water source.

At operation 404, the first fluid 303 is supplied from a first fluid source through the supply lines 227a to the nozzle assembly 300. For example, the first fluid 303 is a gas supplied from a gas source to nozzle assembly 300. The first fluid 303 is heated by the heater 307. The heater 307 heats the first fluid 303 as it passes through the heater 307 to the nozzle assembly 300. The first fluid 303 may become the heated fluid 323 at about 70° C. or greater. The heated fluid 323 may enter the mixing region 309 between about 40 L/min and about 60 L/min. For example, heated fluid 323 may enter the mixing region 309 at about 50 L/min. The heated fluid 323 may enter the mixing region 309 between about 40 psi and about 85 psi, for example between about 45 psi and about 75 psi. In some embodiments, the controller 160 controls and/or monitors the mass flow rate and temperature of the first fluid 303 via sensors and mass flow rate control valves (not shown).

At operation 406 the second fluid 305 is supplied from a second fluid source through the supply lines 227b to the nozzle assembly 300. For example, the second fluid 305 is a liquid supplied from the heated tank 205 to nozzle assembly 300. The second fluid 305 may enter the mixing region 309 between about 50° C. and about 80° C. The second fluid 305 may enter the mixing region 309 between about 20 psi and about 40 psi. The second fluid 305 may enter the mixing region 309 between about 500 mL/min and about 1500 mL/min. For example, the second fluid 305 may enter the mixing region 309 at about 1000 mL/min. In some embodiments, the controller 160 controls and/or monitors the mass flow rate and temperature of the second fluid 305 via mass flow rate control valves, sensors, and pumps (not shown).

In operation 408 of the process 400, the first fluid 303 is mixed with the second fluid 305 within the mixing region 309 of the nozzle body 325. The temperature of the mixture 311 is a function of the volumetric flows, the mass flows, and temperatures of the first fluid 303 and the second fluid 305. The controller 160 may adjust the flow rate of the first fluid 303 and the second fluid 305 to create a mixture 311 that, when sprayed, is between about 40° C. and about 50° C. The controller 160 may adjust the flow rate of the first fluid 303 and the second fluid 305 to create a mixture 311 that, when sprayed, is greater than 35° C. The controller 160 may adjust the flow rate of the first fluid 303 and the second fluid 305 to create a mixture 311 that, when sprayed, is between about 10° C. and about 30° C. above ambient temperature. The controller 160 may adjust the flow rate of the first fluid 303 and the second fluid 305 to create a mixture 311 that, when sprayed, is less than about 40° C. below the temperature of the second fluid 305. For example, the controller 160 may adjust the flow rate of the first fluid 303 and the second fluid 305 to create a mixture 311 that, when sprayed, is less than about 20° C. below the temperature of the second fluid 305. In yet another example, the controller 160 may adjust the flow rate of the first fluid 303 and the second fluid 305 to create a mixture 311 that, when sprayed, is less than a threshold value. The threshold value can be about 20° C. below the temperature of the second fluid 305, or in some cases about 10° C. below the temperature of the second fluid 305, or even about 5° C. below the temperature of the second fluid 305.

In operation 410 of the process 400, the mixture 311 is sprayed from the nozzle orifice 301 onto the surface 120a of the substrate 120. During operation 410, the third fluid 327 may also be applied simultaneously to maintain a liquid film on the surface of the substrate 120a. The third fluid 327 helps keep contaminants from drying to the substrate 120 and allows the contaminants to flow off the substrate surface 120a. The mixture 311 is sprayed and has an impact diameter 313 on the substrate surface 120a. The impact diameter 313 can be adjusted to maintain the mixture 311 in aerosol form. The impact diameter 313 can be between about 3 mm and about 10 mm, for example 7 mm. The aerosol form helps the mixture 311 maintain thermal and kinetic energy better than a vaporized or atomized spray. The additional retained energy of an aerosol further aids in removing contaminants from the substrate 120.

At operation 412, the cleaning arm assembly 220 translates the nozzle assembly 300 across the surface of the substrate 120a while spraying the mixture 311. In some embodiments, the third fluid 327 is also sprayed simultaneously and proximate to where the mixture 311 impacts the substrate surface 120a. In some embodiments, the nozzle assembly 300 is translated in an arc path from the first point 231 on the substrate 120, and the second point 233 on the substrate 120. In some embodiments, the nozzle assembly 300 is translated over the center 235 of the substrate 120. In other embodiments, the nozzle assembly 300 is translated proximate to the center 235 of the substrate 120. In some embodiments the nozzle assembly 300 is translated across the surface of the substrate 120a in a linear motion from the first point 231 to the center 235 of the substrate 120.

At operation 414, the cleaning arm assembly 220 translates the nozzle assembly 300 across the surface of the substrate 120a while spraying the mixture 311. In some embodiments, the third fluid 327 is also sprayed proximate to where the mixture 311 impacts the substrate surface 120a while the mixture 311 is being sprayed. In some embodiments, the nozzle assembly 300 is translated in an arc path from the second point 233 on the substrate 120 back to the first point 231 on the substrate 120. In some embodiments, the nozzle assembly 300 is translated over the center 235 of the substrate 120. In other embodiments, the nozzle assembly 300 is translated proximate to the center 235 of the substrate 120. In some embodiments the nozzle assembly 300 is translated across the surface of the substrate 120a in a linear motion back from the center 235 of the substrate 120 to the first point 231.

The embodiments described herein have the controller 160 utilize the following equations to supply the mixture 311 at a higher temperature to better remove contaminants from a substrate. The temperature of an aerosol mixture that includes gas and liquid is generally influenced more by the temperature of the liquid than the gas. To compensate for the influence of the liquid, the mass flow rate of the gas may be increased. This is because energy is a function of mass.

$$\dot{Q} = \dot{m}C\Delta T \qquad \text{(Eq. 1)}$$

As shown in Eq. 1, the flow of energy $\dot{Q}$ is equal to the mass flow rate, $\dot{m}$, times the heat capacity of the fluid, C, times the change in temperature, $\Delta T$. As the liquid expands to an aerosol, it loses energy. This loss of energy results in a drop in temperature.

$$\dot{Q}_g + \dot{Q}_l = \dot{Q}_m \qquad \text{(Eq. 1.1)}$$

Applying the Eq. 1 to the present embodiments can create Eq. 1.1 where the energy of the gas, $\dot{Q}_g$, plus the energy of the liquid, $\dot{Q}_l$, minus the energy lost to expansion, $Q_{exp}$, is equal to the energy of the mixture, $\dot{Q}_m$. Here, the energy of the liquid includes the energy used to convert the liquid in to an aerosol mixture.

$$\rho = \frac{\dot{m}}{\dot{V}} \; := \; \dot{m} = \rho \dot{V} \qquad \text{(Eq. 2)}$$

The mass flow rate for the gas, liquid, and mixture can be found using Eq. 2, as shown above. In Eq. 2, ṁ is the mass flow rate, ρ is density, and V̇ is the volumetric flow rate. Applying the conservation of mass principles, combing the mass flow rates of the gas and liquid will yield the mass flow rate of the mixture.

$$PV = nRT \quad \text{(Eq. 3)}$$

The changes in temperature can be solved by applying the ideal gas law, Eq. 3, as shown above. In Eq. 3, P is pressure, V is volume, n is the number of moles, R is the ideal gas constant and T is the temperature.

$$\dot{m}_g C_g (T_g - T_m) + \dot{m}_l (C_l (T_l - T_m) - L_l) = \dot{m}_m C_m T_m \quad \text{(Eq. 4)}$$

Expanding Eq. 1 with the concepts of mass flow rate and the ideal gas law yields Eq. 4 as shown above. The mass flow rates are ṁ's, the heat capacities of the fluids are the C's, and the Temperatures at the T's. $L_l$ is the latent heat of vaporization for the liquid.

When these concepts are applied to the embodiments described herein, the mass flow rate of the first fluid 303 and the mass flow rate of the second fluid 305 can be monitored such that the temperature of the mixture 311 is a function of those two variables. For example, the controller has the ability to apply the above equations and known values of constants from multiple gases and liquids such that the flowrates of the gas can be adjusted to correspond to the flowrate of a liquid thereby minimizing a temperature change in the liquid and supply a higher temperature mixture to a substrate. The controller uses the concepts of the ideal gas law and specific heat of a gas and liquid as applied to mass and volumetric flow rates of various gas and liquid combinations so that when the mass flow of the first fluid 303 is very high, and the mass flow rate of the second fluid 305 is much lower, the difference in temperature between the second fluid 305 and the temperature of the mixture 311 can be minimized.

The embodiments described herein enable a cleaning operation with enhanced cleaning ability. The maintenance of the mixture temperature and the consistent droplet size provide enhanced cleaning ability. This enhancement is due to the larger droplets greater ability to dislodge contaminants from the substrate. Additionally, the increased heat from the mixture aids in the ability to further wash away containments from the substrate.

What is claimed is:

1. A method of cleaning a substrate, the method comprising:
   supplying a gas at a gas temperature and a gas mass flow rate to a nozzle, the gas temperature between about 70° C. and about 90° C.;
   supplying a liquid at a liquid temperature and a liquid mass flow rate to the nozzle, the liquid temperature between about 50° C. and about 80° C.;
   mixing the gas with the liquid in the nozzle to form a fluid mixture having a mixture temperature of not more than about 10° C. below the liquid temperature, wherein the mixture temperature is controlled by the gas mass flow rate and the liquid mass flow rate; and
   spraying the fluid mixture onto a surface of the substrate through an orifice in the nozzle, the fluid mixture in an aerosol form, wherein a volumetric flow rate ratio of the gas to the liquid is 500 parts or more of the gas to 1 part liquid.

2. The method of claim 1, further comprising wetting the substrate surface with a third fluid, different from the gas and the liquid, supplied by a wetting nozzle.

3. The method of claim 1, wherein the sprayed fluid mixture comprises droplets having a diameter between about 5 microns and about 30 microns.

4. The method of claim 1, wherein a controller controls the gas mass flow rate and the liquid mass flow rate.

5. The method of claim 1, wherein the sprayed fluid mixture has a percentage of droplets greater than 70%.

6. The method of claim 1, wherein the sprayed fluid mixture has an impact diameter on the surface of the substrate between about 3 mm and about 10 mm.

7. A method of cleaning a substrate, the method comprising:
   wetting a substrate surface with a wetting fluid from a wetting nozzle;
   supplying a gas at a gas mass flow rate and a gas temperature to an aerosol nozzle, the gas temperature between about 60° C. and about 100° C.;
   supplying a liquid at a liquid mass flow rate and a liquid temperature to the aerosol nozzle, wherein the gas temperature is greater than the liquid temperature and the liquid temperature between about 50° C. and about 80° C.;
   mixing the gas and the liquid in the aerosol nozzle to form a fluid mixture at a mixture temperature that is greater than about 35° C., wherein the mixture temperature is controlled by the gas mass flow rate and the liquid mass flow rate;
   spraying the fluid mixture at a surface of the substrate;
   translating the aerosol nozzle from a first point to a second point on the surface of the substrate, wherein a volumetric flow rate ratio of the gas to liquid the is 500 parts or more of the gas to 1 part liquid; and
   translating the aerosol nozzle from the second point to the first point, wherein the wetting fluid is supplied to the substrate surface while translating the aerosol nozzle from the second point to the first point.

8. The method of claim 7, wherein the sprayed fluid mixture comprises droplets having a diameter between about 5 microns and about 30 microns.

9. The method of claim 7, further comprising controlling the gas mass flow rate and the liquid mass flow rate to maintain a maximum change in temperature of less than about 10° C. between the liquid temperature and the mixture temperature.

10. The method of claim 7, wherein less than 50% of the fluid mixture is vaporized.

11. The method of claim 7, further comprising supplying the wetting fluid to the substrate surface while simultaneously spraying the mixture.

12. A cleaning assembly for cleaning a substrate, the cleaning assembly comprising:
   a cleaning arm disposed above a substrate disposed on a substrate support, the cleaning arm comprising:
      an aerosol nozzle disposed on the cleaning arm, wherein the aerosol nozzle is configured to spray a fluid mixture toward the substrate;
      a heater coupled to the cleaning arm, the heater configured to heat a gas that flows to the aerosol nozzle; and a wetting nozzle coupled to the cleaning assembly configured to spray a wetting fluid toward the substrate support; and a controller, the controller comprising a non-transitory computer readable medium comprising instructions that, when executed, cause:

a gas to be delivered to the aerosol nozzle at a first mass flow rate, the gas temperature between about 70° C. and about 90° C.;

a liquid to be delivered to the aerosol nozzle at a second mass flow rate, the liquid temperature between about 50° C. and about 80° C.;

mixing the gas and the liquid in the aerosol nozzle to form the fluid mixture, the controller configured to keep a fluid mixture temperature of not more than about 10° C. below the liquid temperature by controlling the first mass flow rate and the second mass flow rate, wherein the gas has a heat capacity and the liquid has a heat capacity different from the gas; and spraying the mixture of the gas and the liquid, wherein the sprayed mixture has a mixture heat capacity different that than the gas and the liquid.

13. The cleaning assembly of claim 12, wherein the aerosol nozzle comprises an orifice between about 0.01 mm and about 2 mm.

14. The cleaning assembly of claim 12, wherein the non-transitory computer readable medium further comprises instructions for controlling a ratio between the first mass flow rate and the second mass flow rate to maintain the fluid mixture temperature at greater than about 35° C.

15. The cleaning assembly of claim 12, further comprising a heated tank in fluid communication with a supply line and configured to heat the liquid to be delivered to the aerosol nozzle.

16. The cleaning assembly of claim 12, wherein the non-transitory computer readable medium further comprises instructions for controlling a ratio between the first mass flow rate and the second mass flow rate to maintain a maximum change in temperature of less than about 30° C. between the gas and the mixture.

17. The cleaning assembly of claim 12, wherein the non-transitory computer readable medium further comprises instructions for monitoring a volumetric flow ratio of the gas to the liquid is at least equal to or greater than 500 parts of the gas to the liquid.

18. The cleaning assembly of claim 12, wherein the non-transitory computer readable medium further comprises instructions for controlling a temperature of the mixture to be greater than about 35° C.

* * * * *